(12) United States Patent
Zhou

(10) Patent No.: US 11,937,452 B2
(45) Date of Patent: Mar. 19, 2024

(54) DISPLAY SCREEN WITH PHOTOSENSITIVE MATERIAL INCLUDED IN SHIELDING LAYER OR BONDING LAYER, AND DISPLAY DEVICE INCLUDING SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Mingjun Zhou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 724 days.

(21) Appl. No.: 17/051,771

(22) PCT Filed: Jul. 8, 2020

(86) PCT No.: PCT/CN2020/100757
§ 371 (c)(1),
(2) Date: Oct. 29, 2020

(87) PCT Pub. No.: WO2021/208271
PCT Pub. Date: Oct. 21, 2021

(65) Prior Publication Data
US 2023/0165044 A1 May 25, 2023

(30) Foreign Application Priority Data
Apr. 15, 2020 (CN) .......................... 202010296581.3

(51) Int. Cl.
*H10K 50/86* (2023.01)
*G02F 1/1335* (2006.01)
(Continued)

(52) U.S. Cl.
CPC ..... *H10K 50/865* (2023.02); *G02F 1/133512* (2013.01); *G02F 1/1339* (2013.01); *H10K 50/841* (2023.02)

(58) Field of Classification Search
CPC ............... H10K 50/865; H10K 50/841; H10K 59/8792; H10K 59/8722; H10K 59/10;
(Continued)

(56) References Cited

U.S. PATENT DOCUMENTS 9,317,169 B2 * 4/2016 Tokita ................. G06F 3/04166
9,626,063 B2 * 4/2017 Choi ..................... G06F 3/0446
(Continued)

FOREIGN PATENT DOCUMENTS

CN 103676271 A 3/2014
CN 105607321 A 5/2016
(Continued)

*Primary Examiner* — Caleb E Henry
(74) *Attorney, Agent, or Firm* — PV IP PC; Wei Te Chung; Zhigang Ma

(57) ABSTRACT

The present disclosure provides a display screen and a display device. The display screen includes a display panel; a bonding layer disposed on the display panel; a shielding layer disposed on the bonding layer; and a cover plate disposed on the shielding layer; wherein the shielding layer or the bonding layer includes a photosensitive material, and a light transmittance of the photosensitive material becomes less than a threshold under ultraviolet light.

20 Claims, 9 Drawing Sheets

(51) Int. Cl.
*G02F 1/1339* (2006.01)
*H10K 50/84* (2023.01)

(58) Field of Classification Search
CPC ............ G02F 1/133512; G02F 1/1339; G02F 1/133331; G02F 2202/28
See application file for complete search history.

(56) References Cited

U.S. PATENT DOCUMENTS

| | | | |
|---|---|---|---|
| 9,803,117 B2* | 10/2017 | Wang | C09K 3/1006 |
| 9,904,837 B2* | 2/2018 | Lin | G06F 3/0446 |
| 10,925,160 B1* | 2/2021 | Tam | H05K 5/003 |
| 11,116,082 B2* | 9/2021 | Chin | H05K 1/189 |
| 2009/0207350 A1* | 8/2009 | Iida | G02F 1/133512 |
| | | | 349/110 |
| 2013/0009194 A1* | 1/2013 | Yamazaki | H10K 59/38 |
| | | | 257/E33.059 |
| 2014/0078701 A1* | 3/2014 | Tanabe | H10K 59/40 |
| | | | 428/192 |
| 2017/0200773 A1* | 7/2017 | Li | H10K 59/38 |
| 2019/0386217 A1* | 12/2019 | Arai | G03F 7/0381 |

FOREIGN PATENT DOCUMENTS

| | | |
|---|---|---|
| CN | 106383414 A | 2/2017 |
| CN | 107608142 A | 1/2018 |
| CN | 110205037 A | 9/2019 |
| WO | 2018198565 A1 | 11/2018 |

* cited by examiner

_US 11,937,452 B2_

DISPLAY SCREEN WITH PHOTOSENSITIVE MATERIAL INCLUDED IN SHIELDING LAYER OR BONDING LAYER, AND DISPLAY DEVICE INCLUDING SAME

RELATED APPLICATIONS

This application is a Notional Phase of PCT Patent Application No. PCT/CN2020/100757 having international filing date of Jul. 8, 2020, which claims the benefit of priority of Chinese Patent Application No. 202010296581.3 filed on Apr. 15, 2020. The contents of the above applications are all incorporated by reference as if fully set forth herein in their entirety.

BACKGROUND

Field of Invention

The present disclosure relates to a field of display technology, and more particularly, to a display screen, and a display device.

Description of the Prior Art

In an existing display screen 1, as shown in FIG. 1, a black shielding layer 12 is disposed between a cover plate 11 and a display panel 13 to shield internal circuits. Further, a glue layer 14 is also disposed between the cover plate 11 and the display panel 13 to bond the cover plate 11 and the display panel 13, preventing external water and oxygen from corroding internal components of the display screen 1.

Wherein, constituent material of the glue layer 14 is ultraviolet (UV) glue. The UV glue is cured under an irradiation of light emitted by a UV lamp 15. As shown in FIG. 1, the UV lamp 15 is disposed on a side of the cover plate 11. In order to prevent the black shielding layer 12 from blocking the light emitted by the UV lamp 15, the black shielding layer 12 is disposed avoiding a position opposite to the UV lamp 15, which causes a light-shielding effect to decrease.

Therefore, it is necessary to provide a display screen that can improve the light-shielding effect.

SUMMARY

A purpose of the present disclosure is to provide a display screen and a display device, improving a light-shielding effect of the screen.

The present disclosure provides a display screen, including:
  a display panel;
  a bonding layer disposed on the display panel;
  a shielding layer disposed on the bonding layer; and
  a cover plate disposed on the shielding layer;
  wherein the shielding layer or the bonding layer includes a photosensitive material, and a light transmittance of the photosensitive material becomes less than a threshold under ultraviolet light.

In an embodiment, the photosensitive material includes silver halide.

In an embodiment, a mass ratio of the photosensitive material in the shielding layer is between 10% and 50% when the shielding layer includes the photosensitive material.

In an embodiment, when the shielding layer includes the photosensitive material, the shielding layer includes:
  a photosensitive area disposed opposite to the bonding layer, wherein a constituent material of the photosensitive area includes the photosensitive material; and
  a shielding area disposed on two sides of the photosensitive area, wherein a constituent material of the shielding area includes a light-shielding material.

In an embodiment, wherein when the bonding layer includes the photosensitive material, the bonding layer includes:
  a doped area, wherein a constituent material of the doped area includes a glue and the photosensitive material.

In an embodiment, wherein when the bonding layer includes the photosensitive material, the shielding layer includes:
  a first shielding portion;
  second shielding portion; and
  an opening area disposed between the first shielding portion and the second shielding portion, wherein the bonding layer further includes: a non-doped area;
  wherein the doped area of the bonding layer is disposed opposite to the opening area, and the non-doped area is disposed opposite to both the first shielding portion and the second shielding portion.

In an embodiment, when the bonding layer includes the photosensitive material, the shielding layer includes the opening area; and the bonding layer includes a glue layer and a photosensitive layer overlapped, wherein the photosensitive layer is disposed opposite to the opening area.

In an embodiment, wherein the photosensitive layer is disposed on the display panel, and the glue layer is disposed between the photosensitive layer and the shielding layer; or
  wherein the glue layer is disposed on the display panel, and the photosensitive layer is disposed between the glue layer and the shielding layer.

In an embodiment, a thickness of the photosensitive layer ranges from 0.02 mm to 0.2 mm.

In an embodiment, a constituent material of the shielding layer includes black ink.

The present disclosure provides a display device, including a display screen, wherein the display screen includes:
  a display panel;
  a bonding layer disposed on the display panel;
  a shielding layer disposed on the bonding layer; and
  a cover plate disposed on the shielding layer;
  wherein the shielding layer or the bonding layer includes a photosensitive material, and a light transmittance of the photosensitive material becomes less than a threshold under ultraviolet light.

In an embodiment, the photosensitive material includes silver halide.

In an embodiment, a mass ratio of the photosensitive material in the shielding layer is between 10% and 50% when the shielding layer includes the photosensitive material.

In an embodiment, when the shielding layer includes the photosensitive material, the shielding layer includes:
  a photosensitive area disposed opposite to the bonding layer, wherein a constituent material of the photosensitive area includes the photosensitive material; and
  a shielding area disposed on two sides of the photosensitive area, wherein a constituent material of the shielding area includes a light-shielding material.

In an embodiment, wherein when the bonding layer includes the photosensitive material, the bonding layer includes:
  a doped area, wherein a constituent material of the doped area includes a glue and the photosensitive material.

In an embodiment, wherein when the bonding layer includes the photosensitive material, the shielding layer includes:

a first shielding portion;

a second shielding portion; and an opening area disposed between the first shielding portion and the second shielding portion, wherein the bonding layer further includes a non-doped area;

wherein the doped area of the bonding layer is disposed opposite to the opening area, and the non-doped area is disposed opposite to both the first shielding portion and the second shielding portion.

In an embodiment, wherein when the bonding layer includes the photosensitive material, the shielding layer includes the opening area; and the bonding layer includes a glue layer and a photosensitive layer overlapped, and the photosensitive layer is disposed opposite to the opening area.

In an embodiment, wherein the photosensitive layer is disposed on the display panel, and the glue layer is disposed between the photosensitive layer and the shielding layer; or wherein the glue layer is disposed on the display panel, and the photosensitive layer is disposed between the glue layer and the shielding layer.

In an embodiment, a thickness of the photosensitive layer ranges from 0.02 mm to 0.2 mm.

In an embodiment, a constituent material of the shielding layer includes black ink.

In the display screen and the display device of the embodiment of the present disclosure, the photosensitive material is disposed in the shielding material or the bonding layer, and the light transmittance of the photosensitive material becomes less than the threshold under the ultraviolet light to improve the light-shielding effect of the screen.

BRIEF DESCRIPTION OF DRAWINGS

Technical solutions and other beneficial effects of the present disclosure will be obvious by describing the specific implementation of the present disclosure in detail with reference to the accompanying drawings.

DETAILED DESCRIPTION OF PREFERRED EMBODIMENTS

Figure 1:
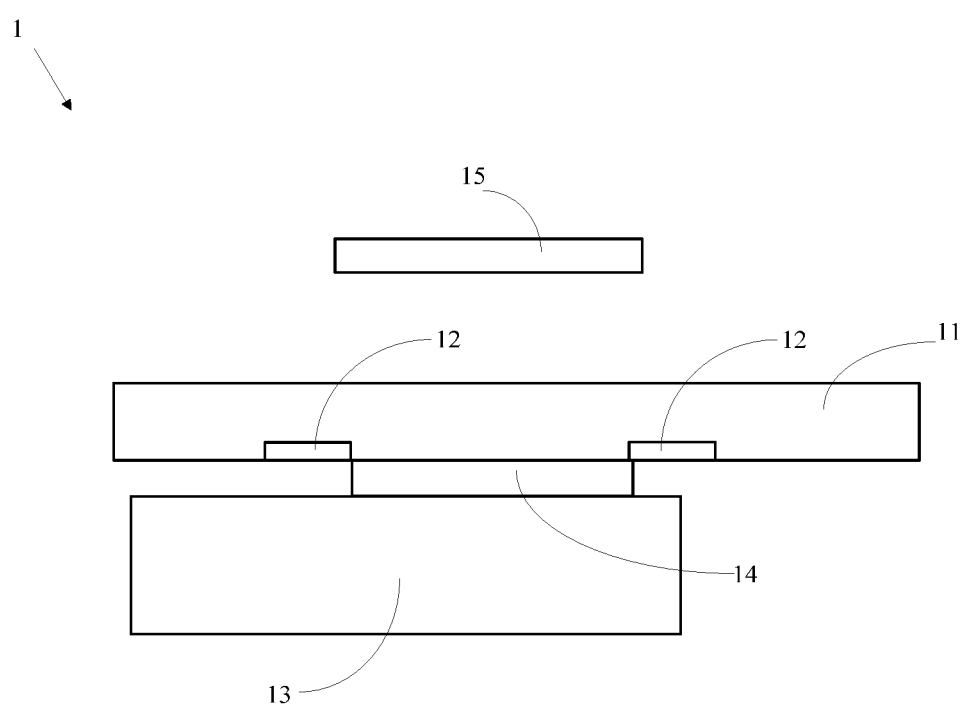
FIG. 1 is structural schematic diagram of an existing display screen.

Embodiments of the present disclosure are described in detail with the technical matters, structural features, achieved objects, and effects with reference to the accompanying drawings as follows. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the description of the present disclosure, it should be noted that unless otherwise clearly defined and limited, the terms "mounted", "connected/coupled", and "connection" should be interpreted broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should he noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly; they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

Figure 2:
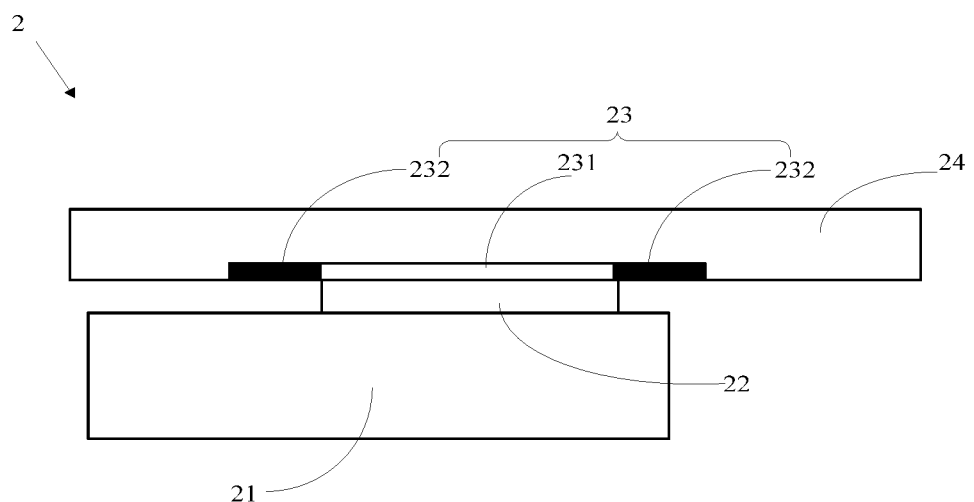
FIG. 2 is a first structural schematic diagram of a display screen according to an embodiment of the present disclosure.

The present disclosure provides a display device. The display device includes a display screen. Please refer to FIG. 2, FIG. 2 is a structural schematic diagram of the display screen according to an embodiment of the present disclosure. As shown in FIG. 2, a display screen 2 includes a display panel 21, a bonding layer 22, a shielding layer 23, and a cover plate 24. Wherein the bonding layer 22 is disposed on the display panel 21. The shielding layer 23 is disposed on the bonding layer 22. The cover plate 24 is disposed on the shielding layer 23.

The display panel 21 can be a liquid crystal display panel or an organic light-emitting panel, which is not specifically limited herein. The cover plate 24 covers the display panel 21. The cover plate 24 can be made of high-hardness materials such as glass, sapphire, or ceramics, and has a good wear-resisting property to protect internal components in the display panel 21.

In order to prevent components in the display panel 21 from being exposed on an appearance surface, the shielding layer 23 is disposed on a side of the cover plate 24 close to the display panel 21. Wherein, the shielding layer 23 can be made of a light-shielding material, specifically, such as a material with a light transmittance less than 10%. Specifically, a constituent material of the shielding layer 23 can include black ink.

The bonding layer 22 is disposed between the shielding layer 23 and the display panel 21. Wherein, a constituent material of the bonding layer 22 includes UV glue. The UV glue is cured under an irradiation of ultraviolet light to fix the display panel 21 and the cover plate 24.

Wherein, the shielding layer 23 or the bonding layer 22 includes a photosensitive material, and a light transmittance of the photosensitive material becomes less than a threshold under ultraviolet light. Wherein, the photosensitive material includes silver halide such as silver bromide, silver iodide and the like. For example, the silver iodide is a yellowish solid. When adopting the ultraviolet light to cure the bonding layer 22, the ultraviolet light can irradiate on the UV glue by passing through the silver iodide in the shielding layer 23 or directly irradiate on the UV glue in the bonding layer 22. With an end of curing the UV glue, the silver iodide is further broken down and turned black under the irradiation of the ultraviolet light, so that the light transmittance of the shielding layer 23 or the bonding layer 22 is reduced to shield the internal components in the display panel 21. In summary, the shielding layer 23 or the bonding layer 22 including the photosensitive material not only can ensure the UV glue to be cured under sufficient ultraviolet light, but also improves a light-shielding effect of the display screen 2.

According to an embodiment, when the shielding layer 23 includes the photosensitive material, a mass ratio of the photosensitive material in the shielding layer 23 is between 10% and 50%.

When the shielding layer 23 includes the photosensitive material, as shown in FIG. 2, the shielding layer 23 includes: a photosensitive area 231 and a shielding area 232. Wherein, a constituent material of the photosensitive area 231 includes the photosensitive material. The shielding area 232 is disposed on two sides of the photosensitive area 231, and a constituent material of the shielding area 232 includes the light-shielding material. Wherein, the photosensitive area 231 is disposed opposite to the bonding layer 22.

Figure 3:
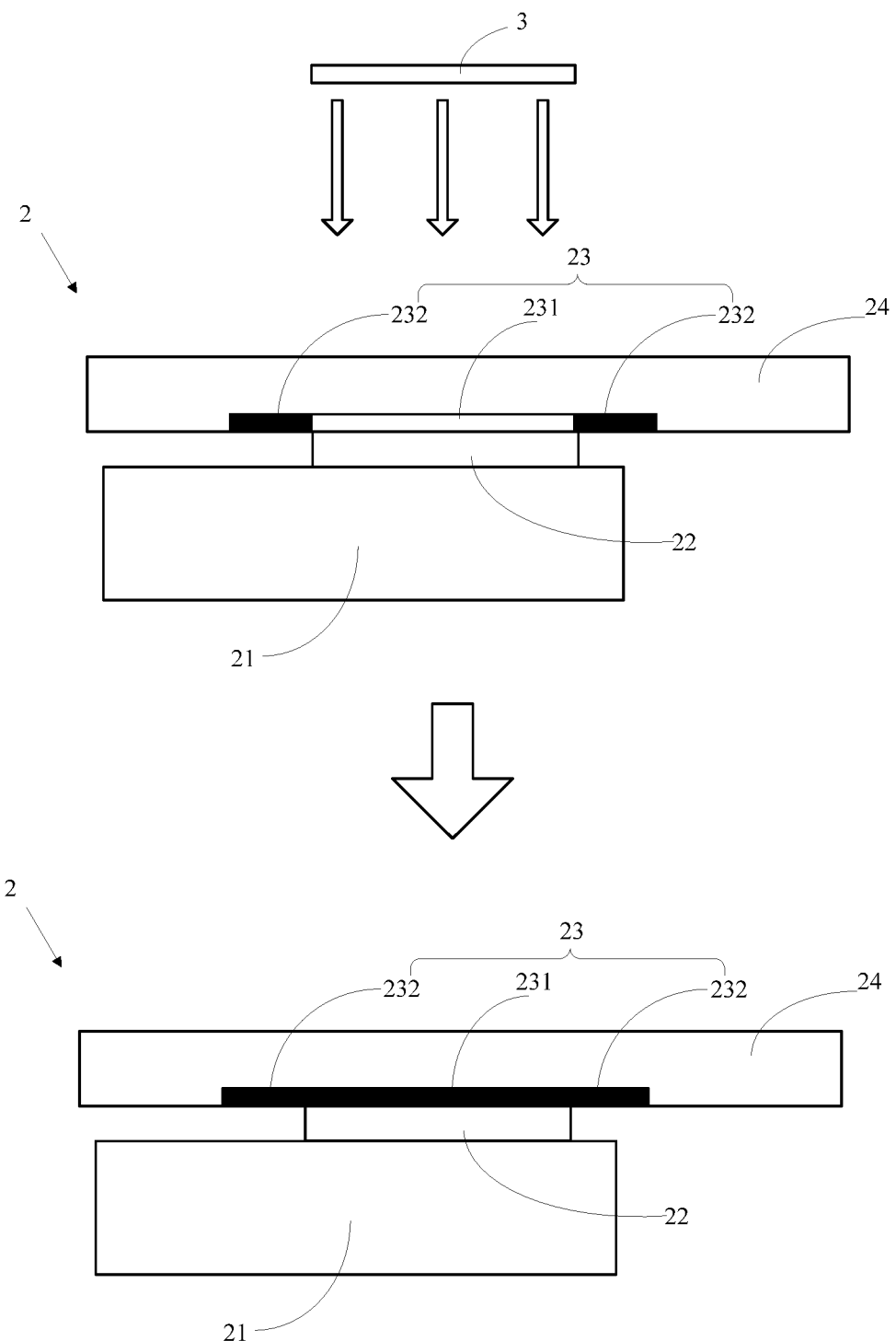
FIG. 3 is a first scenario schematic diagram of curing a bonding layer according to an embodiment of the present disclosure.

As shown in FIG. 3, when the UV lamp 3 emits the ultraviolet light to the bonding layer 22 from a side close to the cover plate 24, the ultraviolet light can pass through the photosensitive material in the photosensitive area 231 and irradiate the bonding layer 22 to make the UV glue in the bonding layer 22 cured. With an end of a curing process of the bonding layer 22, the light transmittance of the photosensitive material in the photosensitive area 231 becomes less than a threshold under the ultraviolet light, and the photosensitive area 231 and the shielding area 232 together realize a function of shielding the components in the display panel 21.

When the bonding layer 22 includes the photosensitive material, the shielding layer 23 includes a first shielding portion 233, a second shielding portion 234, and an opening area 235 disposed between the first shielding portion 233 and the second shielding portion 234.

In an embodiment, the bonding layer 22 includes a doped area 221. A constituent material of the doped area 221 includes a glue and the photosensitive material. Wherein, a doping ratio of the photosensitive material in the doped region 221 is between 10% and 50%.

Figure 4:
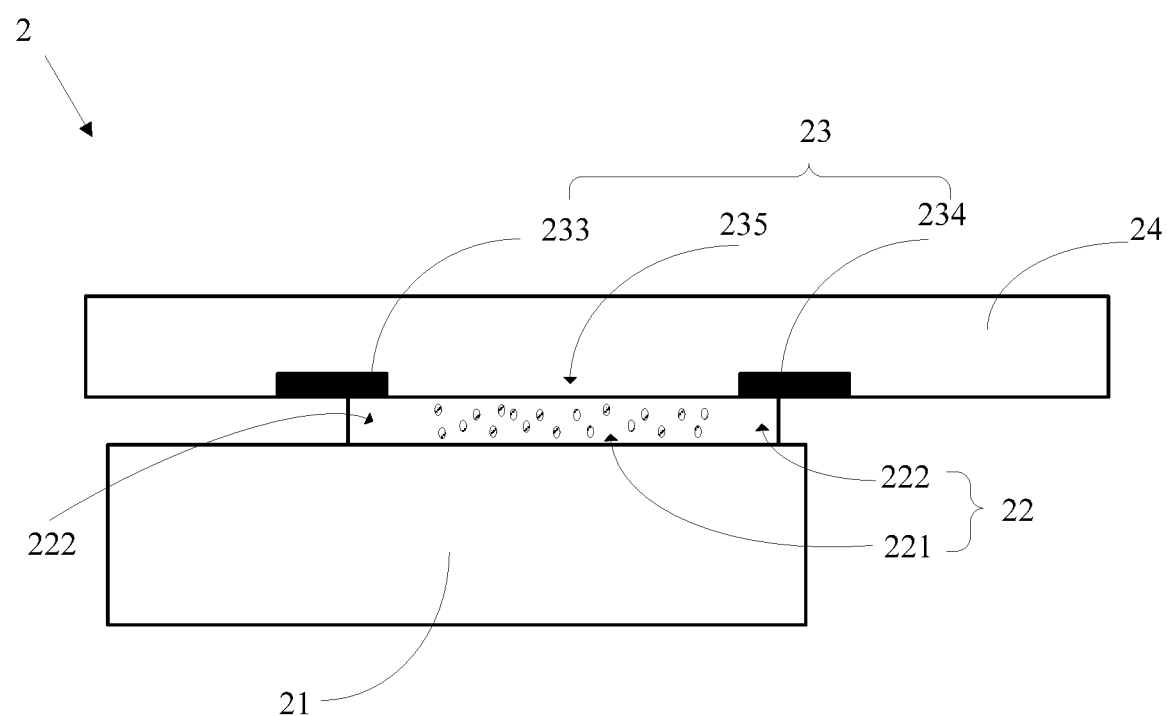
FIG. 4 is a second structural schematic diagram of the display screen according to an embodiment of the present disclosure.

It should be noted that, in an embodiment, the photosensitive material can be doped in an entire bonding layer. That is, the bonding layer 22 only includes the doped area 221. In another embodiment, as shown in FIG. 4, the bonding layer 22 further includes a non-doped area 222. Wherein, a constituent material of the non-doped area 222 includes the glue and does not include the photosensitive material, improving a bonding performance of the bonding layer 22.

Figure 5:
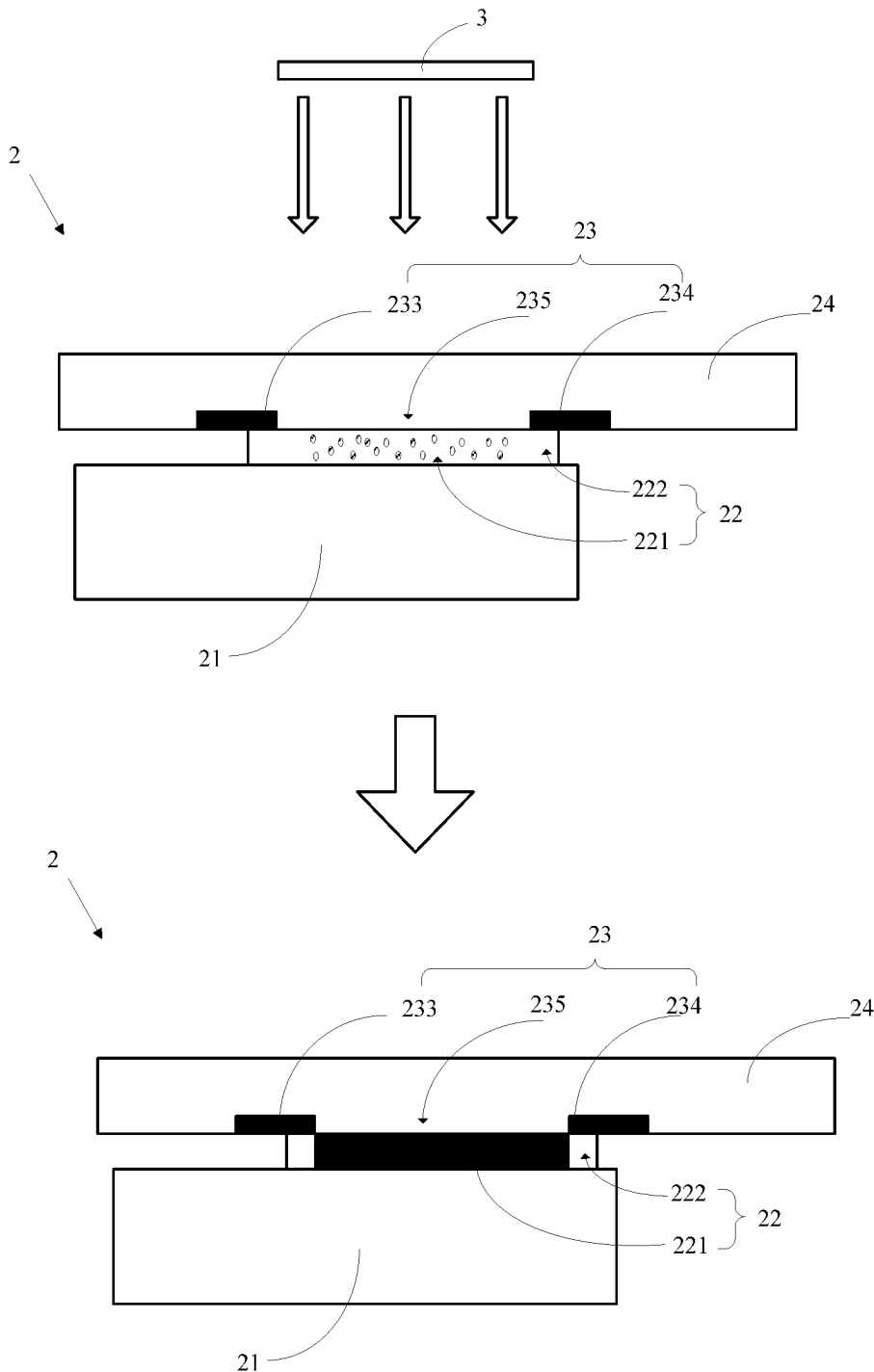
FIG. 5 is a second scenario schematic diagram of curing the bonding layer according to an embodiment of the present disclosure.

Wherein, the doped area 221 of the bonding layer 22 is disposed opposite to the opening area 235, and opposite to the first shielding portion 233. As shown in FIG. 5, when the UV lamp 3 emits the ultraviolet light to the bonding layer 22 from the side close to the cover plate 24, the UV glue in the bonding layer 22 becomes cured. With the end of the curing process of the bonding layer 22, the light transmittance of the photosensitive material in the doped area 221 becomes less than a threshold under the ultraviolet light. The doped area 221, the second shielding portion 234, and the first shielding portion 233 together realize the function of shielding the components in the display panel 21.

Figure 6:
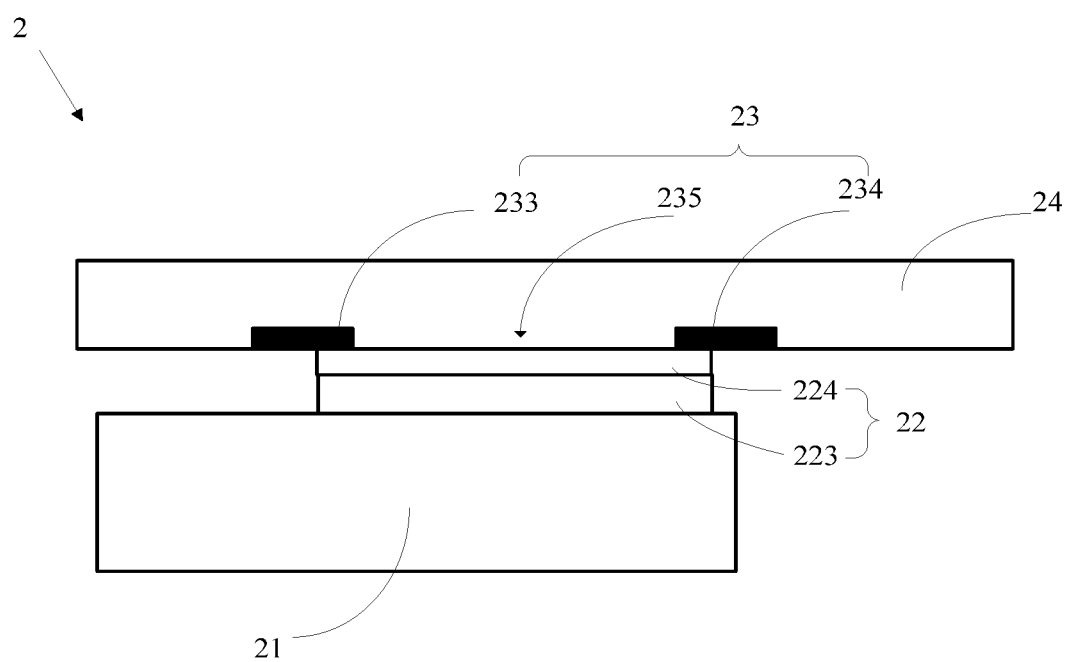
FIG. 6 is a third structural schematic diagram of the display screen according to an embodiment of the present disclosure.
Figure 7:
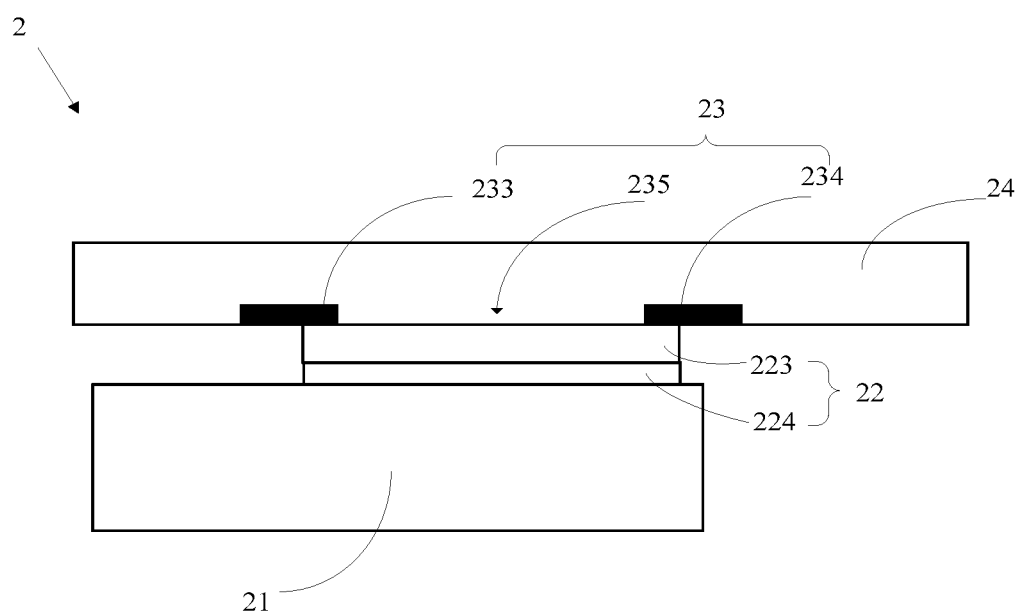
FIG. 7 is a fourth structural schematic diagram of the display screen according to an embodiment of the present disclosure.

When the bonding layer 22 includes the photosensitive material, the bonding layer 22 includes a glue layer 224 and a photosensitive layer 223 stacked. The photosensitive layer 223 is disposed opposite to the opening area 235. In an embodiment, as shown in FIG. 6, the photosensitive layer 223 is disposed on the display panel 21, and the glue layer 224 is disposed between the photosensitive layer 223 and the shielding layer 23. In another embodiment, as shown in FIG. 7, the glue layer 224 is disposed on the display panel 21, and the photosensitive layer 223 is disposed between the glue layer 224 and the shielding layer 23. Wherein, a thickness of the photosensitive layer 223 ranges from 0.02 mm to 0.2 mm.

Figure 8:
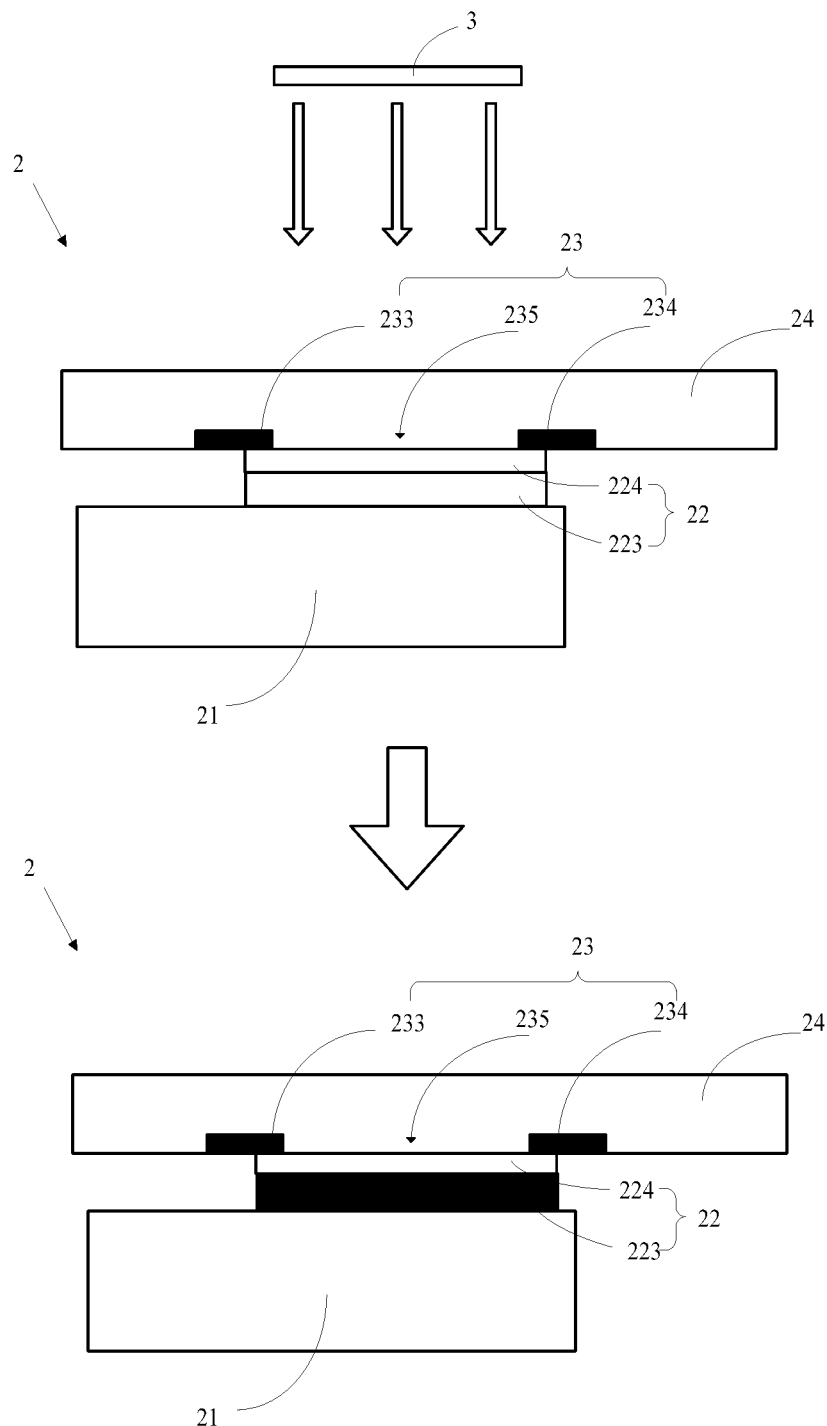
FIG. 8 is a third scenario schematic diagram of curing the bonding layer according to an embodiment of the present disclosure.
Figure 9:
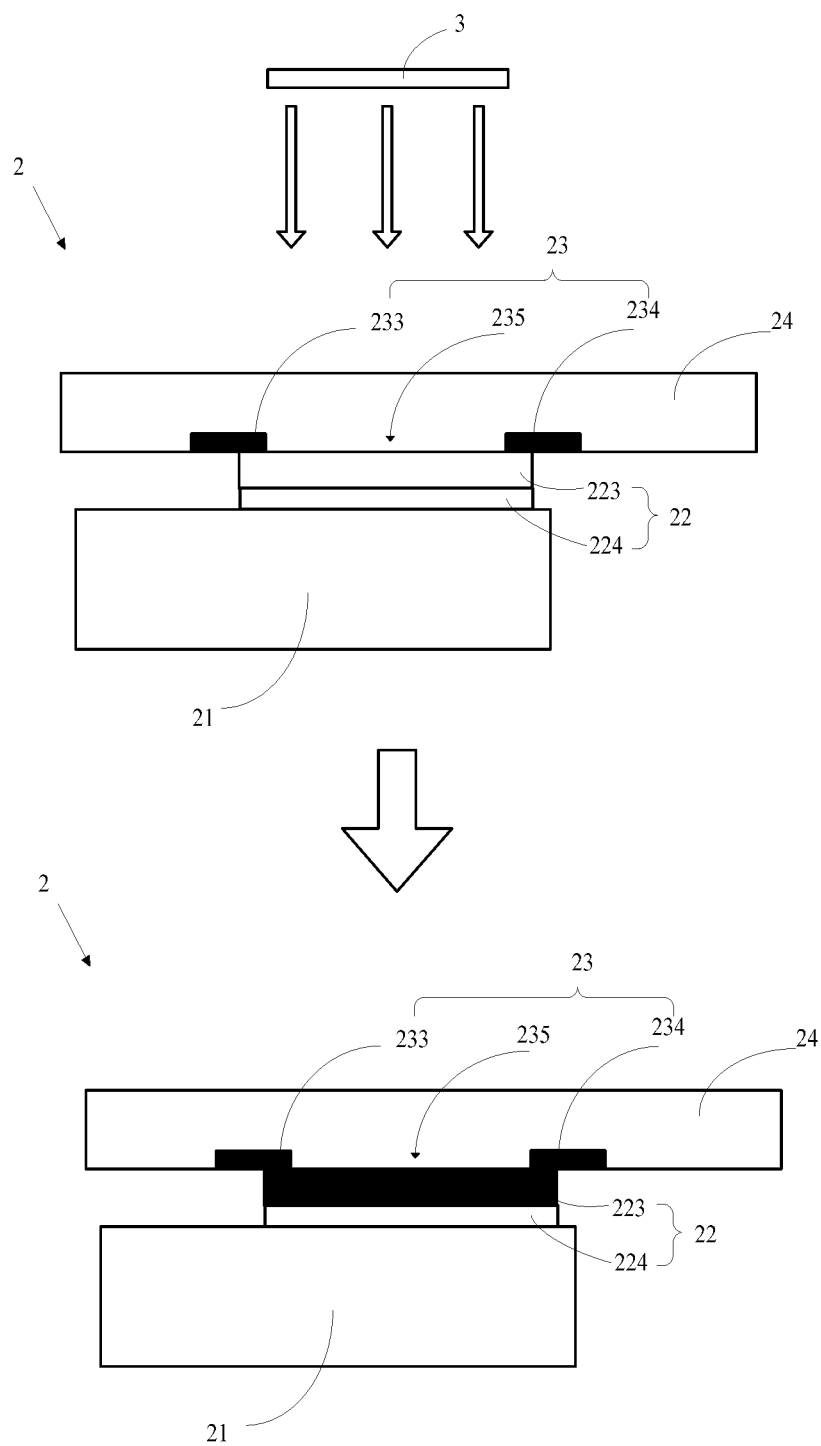
FIG. 9 is a fourth scenario schematic diagram of curing the bonding layer according to an embodiment of the present disclosure.

As shown in FIG. 8 or FIG. 9, when the UV lamp 3 emits the ultraviolet light to the bonding layer 22 from the side close to the cover plate 24, the UV glue in the glue layer 224 becomes cured. With an end of the curing process of the glue layer 224, the light transmittance of the photosensitive material in the photosensitive layer 223 becomes less than a threshold under the ultraviolet light. The photosensitive layer 223, the second shielding portion 234, and the first shielding portion 233 together realize the function of shielding the components in the display panel 21.

In the display screen and the display device of the embodiment of the present disclosure, the photosensitive material is disposed in the shielding material or the bonding layer, and the light transmittance of the photosensitive material becomes less than the threshold under the ultraviolet light to improve the light-shielding effect of the screen.

In the foregoing embodiments, the description of each embodiment has its own emphasis. For the parts that are not described in detail in one embodiment, reference may be made to related descriptions in other embodiments.

The display screen and the display device provided by the embodiments of the present disclosure are described in detail. The principles and implementations of the present disclosure are described in combination with specific embodiments. The above description of the embodiments is merely for the purpose of understanding the disclosure. In the meantime, for those skilled in the art, there will be changes in the specific implementation and application scope according to the idea of the present disclosure. In conclusion, the content of the specification of the present disclosure should not be construed as limitations of the scope of the present disclosure.

What is claimed is:

1. A display screen, comprising:
    a display panel;
    a bonding layer disposed on the display panel;
    a shielding layer disposed on the bonding layer; and
    a cover plate disposed on the shielding layer;
    wherein the shielding layer or the bonding layer comprises a photosensitive material, and a light transmittance of the photosensitive material becomes less than a threshold under ultraviolet light,
    wherein a mass ratio of the photosensitive material in the shielding layer is between 10% and 50% when the shielding layer comprises the photosensitive material.

2. The display screen as claimed in claim 1, wherein the photosensitive material comprises silver halide.

3. The display screen as claimed in claim 1, wherein when the shielding layer comprises the photosensitive material, the shielding layer comprises:
    a photosensitive area disposed opposite to the bonding layer, wherein a constituent material of the photosensitive area comprises the photosensitive material; and
    a shielding area disposed on two sides of the photosensitive area, wherein a constituent material of the shielding area comprises a light-shielding material.

4. The display screen as claimed in claim 1, wherein when the bonding layer comprises the photosensitive material, the bonding layer comprises:
    a doped area, wherein a constituent material of the doped area comprises a glue and the photosensitive material.

5. The display screen as claimed in claim 4, wherein when the bonding layer comprises the photosensitive material, the shielding layer comprises:
    a first shielding portion;
    a second shielding portion; and
    an opening area disposed between the first shielding portion and the second shielding portion, wherein the bonding layer further comprises a non-doped area;
    wherein the doped area of the bonding layer is disposed opposite to the opening area, and the non-doped area is disposed opposite to both the first shielding portion and the second shielding portion.

6. The display screen as claimed in claim 1, wherein when the bonding layer comprises the photosensitive material, the shielding layer comprises an opening area, the bonding layer comprises a glue layer and a photosensitive layer overlapped, and the photosensitive layer is disposed opposite to the opening area.

7. The display screen as claimed in claim 6,
    wherein the photosensitive layer is disposed on the display panel, and the glue layer is disposed between the photosensitive layer and the shielding layer; or
    wherein the glue layer is disposed on the display panel, and the photosensitive layer is disposed between the glue layer and the shielding layer.

8. The display screen as claimed in claim 6, wherein a thickness of the photosensitive layer ranges from 0.02 mm to 0.2 mm.

9. The display screen as claimed in claim 1, wherein a constituent material of the shielding layer comprises black ink.

10. A display device, comprising a display screen, wherein the display screen comprises:
    a display panel;
    a bonding layer disposed on the display panel;
    a shielding layer disposed on the bonding layer; and
    a cover plate disposed on the shielding layer;
    wherein the shielding layer or the bonding layer comprises a photosensitive material, and a light transmittance of the photosensitive material becomes less than a threshold under ultraviolet light,
    wherein a mass ratio of the photosensitive material in the shielding layer is between 10% and 50% when the shielding layer comprises the photosensitive material.

11. The display device as claimed in claim 10, wherein the photosensitive material comprises silver halide.

12. The display device as claimed in claim 10, wherein when the shielding layer comprises the photosensitive material, the shielding layer comprises:
    a photosensitive area disposed opposite to the bonding layer, wherein a constituent material of the photosensitive area comprises the photosensitive material; and
    a shielding area disposed on two sides of the photosensitive area, wherein a constituent material of the shielding area comprises a light-shielding material.

13. The display device as claimed in claim 10, wherein when the bonding layer comprises the photosensitive material, the bonding layer comprises:
    a doped area, wherein a constituent material of the doped area comprises a glue and the photosensitive material.

14. The display device as claimed in claim 13, wherein when the bonding layer comprises the photosensitive material, the shielding layer comprises:
    a first shielding portion;
    a second shielding portion; and
    an opening area disposed between the first shielding portion and the second shielding portion, wherein the bonding layer further comprises a non-doped area;
    wherein the doped area of the bonding layer is disposed opposite to the opening area, and the non-doped area is disposed opposite to both the first shielding portion and the second shielding portion.

15. The display device as claimed in claim 10, wherein when the bonding layer comprises the photosensitive material, the shielding layer comprises an opening area, the bonding layer comprises a glue layer and a photosensitive layer overlapped, and the photosensitive layer is disposed opposite to the opening area.

16. The display device as claimed in claim 15,
wherein the photosensitive layer is disposed on the display panel, and the glue layer is disposed between the photosensitive layer and the shielding layer; or
wherein the glue layer is disposed on the display panel, and the photosensitive layer is disposed between the glue layer and the shielding layer.

17. The display device as claimed in claim 15, wherein a thickness of the photosensitive layer ranges from 0.02 mm to 0.2 mm.

18. The display device as claimed in claim 10, wherein a constituent material of the shielding layer comprises black ink.

19. A display screen, comprising:
a display panel;
a bonding layer disposed on the display panel;
a shielding layer disposed on the bonding layer; and
a cover plate disposed on the shielding layer;
wherein the shielding layer or the bonding layer comprises a photosensitive material, and a light transmittance of the photosensitive material becomes less than a threshold under ultraviolet light,
wherein when the bonding layer comprises the photosensitive material, the shielding layer comprises an opening area, the bonding layer comprises a glue layer and a photosensitive layer overlapped, and the photosensitive layer is disposed opposite to the opening area.

20. The display screen as claimed in claim 19,
wherein the photosensitive layer is disposed on the display panel, and the glue layer is disposed between the photosensitive layer and the shielding layer; or
wherein the glue layer is disposed on the display panel, and the photosensitive layer is disposed between the glue layer and the shielding layer.

\* \* \* \* \*